(12) United States Patent
Abraham et al.

(10) Patent No.: US 8,456,895 B2
(45) Date of Patent: Jun. 4, 2013

(54) MAGNONIC MAGNETIC RANDOM ACCESS MEMORY DEVICE

(75) Inventors: David W. Abraham, Croton, NY (US); Niladri N. Mojumder, Lafayette, IN (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 13/100,032

(22) Filed: May 3, 2011

(65) Prior Publication Data

US 2012/0281467 A1 Nov. 8, 2012

(51) Int. Cl.
G11C 11/00 (2006.01)
G11C 11/14 (2006.01)
G11C 11/15 (2006.01)

(52) U.S. Cl.
USPC ............................ 365/158; 365/171; 365/173

(58) Field of Classification Search
USPC ......................................... 365/158, 171, 173
See application file for complete search history.

(56) References Cited

U.S. PATENT DOCUMENTS

| 5,640,343 | A | 6/1997 | Gallagher et al. |
|---|---|---|---|
| 5,966,012 | A | 10/1999 | Parkin |
| 6,259,586 | B1 | 7/2001 | Gill |
| 6,300,150 | B1 | 10/2001 | Venkatasubramanian |
| 6,545,896 | B1 | 4/2003 | Munden et al. |
| 6,650,513 | B2 | 11/2003 | Fullerton et al. |
| 6,724,674 | B2 | 4/2004 | Abraham et al. |
| 6,759,263 | B2 | 7/2004 | Ying et al. |
| 6,771,534 | B2 | 8/2004 | Stipe |
| 6,809,900 | B2 | 10/2004 | Covington |
| 6,819,586 | B1 | 11/2004 | Anthony et al. |
| 6,836,392 | B2 | 12/2004 | Carey et al. |
| 6,950,260 | B2 | 9/2005 | Coffey et al. |
| 6,977,838 | B1 * | 12/2005 | Tsang et al. .................. 365/158 |
| 6,985,383 | B2 * | 1/2006 | Tang et al. .................... 365/158 |
| 7,035,137 | B2 * | 4/2006 | Iwata et al. .................... 365/158 |
| 7,154,771 | B2 | 12/2006 | Braun |
| 7,372,116 | B2 | 5/2008 | Fullerton et al. |
| 7,411,815 | B2 | 8/2008 | Gogl |
| 7,486,545 | B2 | 2/2009 | Min et al. |
| 7,593,278 | B2 * | 9/2009 | Hu et al. ....................... 365/158 |
| 7,602,000 | B2 | 10/2009 | Sun et al. |

(Continued)

OTHER PUBLICATIONS

International Search Report; International Application No. PCT/US2012/029881; International Filing Date: Mar. 21, 2012; Date of Mailing: Jun. 8, 2012; 5 pages.

(Continued)

*Primary Examiner* — Trong Phan
(74) *Attorney, Agent, or Firm* — Cantor Colburn LLP; Vazken Alexanian

(57) ABSTRACT

A mechanism is provided for bidirectional writing. A structure includes a reference layer on top of a tunnel barrier, a free layer underneath the tunnel barrier, a metal spacer underneath the free layer, an insulating magnet underneath the metal spacer, and a high resistance layer underneath the insulating layer. The high resistance layer acts as a heater in which the heater heats the insulating magnet to generate spin polarized electrons. A magnetization of the free layer is destabilized by the spin polarized electrons generated from the insulating magnet. A voltage is applied to change the magnetization of the free layer when the magnetization is destabilized. A polarity of the voltage determines when the magnetization of the free layer is parallel and antiparallel to a magnetization of the reference layer.

16 Claims, 8 Drawing Sheets

U.S. PATENT DOCUMENTS

| | | | |
|---|---|---|---|
| 7,606,065 B2* | 10/2009 | Fontana et al. | 365/158 |
| 7,796,428 B2 | 9/2010 | Redon | |
| 8,054,677 B2 | 11/2011 | Zhu | |
| 8,089,132 B2 | 1/2012 | Zheng et al. | |
| 8,199,564 B2 | 6/2012 | Zheng et al. | |
| 8,217,478 B2 | 7/2012 | Lou et al. | |
| 8,223,532 B2 | 7/2012 | Wang et al. | |
| 2002/0121094 A1 | 9/2002 | VanHoudt | |
| 2005/0117392 A1 | 6/2005 | Hayakawa et al. | |
| 2005/0167770 A1 | 8/2005 | Fukuzawa et al. | |
| 2006/0013039 A1 | 1/2006 | Braun et al. | |
| 2009/0051880 A1 | 2/2009 | Ito | |
| 2009/0052222 A1 | 2/2009 | Hu et al. | |
| 2009/0161422 A1 | 6/2009 | Zhu et al. | |
| 2009/0175110 A1 | 7/2009 | Zayets et al. | |
| 2010/0080047 A1 | 4/2010 | Liu et al. | |
| 2010/0091563 A1 | 4/2010 | Zheng et al. | |
| 2010/0110783 A1 | 5/2010 | Liu et al. | |
| 2010/0148167 A1 | 6/2010 | Whig et al. | |
| 2010/0208516 A1 | 8/2010 | Javerliac et al. | |
| 2010/0271870 A1 | 10/2010 | Zheng et al. | |
| 2011/0063758 A1 | 3/2011 | Wang et al. | |
| 2011/0146741 A1 | 6/2011 | Hida et al. | |

OTHER PUBLICATIONS

Written Opinion of the International Searching Authority; International Application No. PCT/US2012/029881; International Filing Date: Mar. 21, 2012; Date of Mailing: Jun. 8, 2012; 9 pages.

Fukushima, et al., "Peltier Effect in Sub-Micron-Size Metallic Junctions", Jpn. J. Appl. Phys., vol. 44, 2005, pp. L12-L14.

Lee, et al., "Increase of Temperature Due to Joule Heating During Current-Induced Magnetization Switching of an MgO-Based Magnetic Tunnel Junction", Appl. Phys. Lett., vol. 92, 2008, 233502.

Li, et al., "Characterization of Sputtered Barium Ferrite Thin Films on Silicon-Nitride-Coated Carbon Substrates", Materials Research Society Symposium Proceedings, vol. 341, 1994, pp. 59-64.

Ohta, et al., "Giant Thermoelectric Seeback Coefficient of a Two-Dimensional Electron Gas in $SrTiO_3$", Nature Materials, vol. 6, 2007. pp. 129-134.

Slonczewski, et al., "Initiation of Spin-Torque by Thermal Transport from Magnons", Physical Review B, vol. 82, Issue 5, 2010, 054403; pp. 054403-1-11.

Sugihara, et al., "Giant Peltier Effect in a Submicron-Sized Cu-Ni/Au Junction with Nanometer-Scale Phase Separation", Appl. Phys. Express, vol. 3, 2010, 065204.

Sui, et al., "Barium Ferrite Thin-Film Recording Media", Journal of Magnetism and Magnetic Materials, vol. 155, Issues 1-3, Mar. 2, 1996, pp. 132-139.

Zhang, et al., "Thermoelectric Performance of Silicon Nanowires", Appl. Phys. Lett., vol. 94, 2009, 213108.

International Search Report; International Application No. PCT/US12/31938; International Filing Date: Apr. 3, 2012; Date of Mailing: Jun. 22, 2012; 5 pages.

Written Opinion of the International Searching Authority; International Application No. PCT/US12/31938; International Filing Date: Apr. 3, 2012; Date of Mailing: Jun. 22, 2012; 6 pages.

* cited by examiner

MAGNONIC MAGNETIC RANDOM ACCESS MEMORY DEVICE

BACKGROUND

Exemplary embodiments relate to memory, and more specifically, to bidirectional writing for a magnetic memory device.

Magnetic Random Access Memory (MRAM) is a non-volatile computer memory (NVRAM) technology. Unlike conventional RAM chip technologies, in MRAM data is not stored as electric charge or current flows, but by magnetic storage elements. The elements are formed using two ferromagnetic plates, separated by a thin insulating layer. One of the two plates is a permanent magnet set to a particular polarity; the other's field can be changed to match that of an external field to store digital data. This configuration is known as a spin valve and is the simplest structure for a MRAM bit. A memory device is built from a grid of such "cells".

The simplest method of reading is accomplished by measuring the electrical resistance of the cell. A particular cell is (typically) selected by turning on an associated access transistor which passes current from a supply line through the cell to ground. Due to the magnetic tunnel effect, the electrical resistance of the cell changes with the relative orientation of the fields between the two plates. By measuring the resulting current, the resistance associated with any particular cell can be determined, and from this magnetic orientation of the writable plate. Typically if the two plates have the same orientation the cell is considered to hold a value of "0", while if the two plates are of opposite orientation the resistance will be higher and will hold a value of "1".

Data is written to the cells using a variety of means. In one method for field-written MRAM, each cell lies between a pair of write lines arranged at right angles to each other, above and below the cell. When current is passed through them, an induced magnetic field is created at the junction, which acts on the writable plate and under proper conditions will cause the writable plate to reverse its orientation.

BRIEF SUMMARY

According to an exemplary embodiment, a method for bidirectional writing is provided. The method provides a structure, which includes a reference layer adjacent to a tunnel barrier, a free layer adjacent to the tunnel barrier, a metal spacer adjacent to the free layer, an insulating magnet adjacent to the metal spacer, and a high resistance layer adjacent to the insulating layer. The method includes causing the insulating magnet to generate spin polarized electrons in response to a thermal gradient, destabilizing a magnetization of the free layer by the spin polarized electrons generated from the insulating magnet, and applying a voltage to the structure in order to select the magnetization of the free layer, during or slightly after a time when the magnetization of the free layer is destabilized. A polarity of the voltage determines when the magnetization of the free layer is parallel and antiparallel to a magnetization of the reference layer.

According to an exemplary embodiment, a magnetic random access memory device for bidirectional writing is provided. A structure includes a reference layer adjacent to a tunnel barrier, a free layer adjacent to the tunnel barrier, a metal spacer adjacent to the free layer, an insulating magnet adjacent to the metal spacer, and a high resistance layer adjacent to the insulating layer. Responsive to a thermal gradient, the insulating magnet is caused to generate spin polarized electrons. The spin polarized electrons generated from the insulating magnet destabilize a magnetization of the free layer. A voltage of a voltage source is applied to the structure to change the magnetization of the free layer when the magnetization of the free layer is destabilized. A polarity of the voltage determines when the magnetization of the free layer is parallel and antiparallel to a magnetization of the reference layer.

According to an exemplary embodiment, a method for bidirectional writing is provided. The method provides a structure, which include a reference layer adjacent to a tunnel barrier, a free layer adjacent to the tunnel barrier, a metal spacer adjacent to the free layer, and an insulating magnet adjacent to the metal spacer. The method includes applying a voltage to the structure with a high pulse to cause the tunnel barrier to act as a heater in which the heater heats the insulating magnet to generate spin polarized electrons, and destabilizing a magnetization of the free layer by the spin polarized electrons generated from magnons in the insulating magnet which are converted to the spin-aligned electrons. Also, the method includes applying the voltage with a low pulse to change the magnetization of the free layer when the magnetization of the free layer is destabilized, in which the low pulse is configured not to cause the tunnel barrier to act as an interfering source of heat. A polarity of the voltage determines when the magnetization of the free layer is parallel and antiparallel to a magnetization of the reference layer.

According to an exemplary embodiment, a magnetic random access memory device for bidirectional writing is provided. A structure includes a reference layer adjacent to a tunnel barrier, a free layer adjacent to the tunnel barrier, a metal spacer adjacent to the free layer, and an insulating magnet adjacent to the metal spacer. When a voltage is applied to the structure with a high pulse, the high pulse is configured to cause the tunnel barrier to act as a heater in which the heater heats the insulating magnet to generate spin polarized electrons. The high pulse is configured to destabilize a magnetization of the free layer by the spin polarized electrons generated from the insulating magnet. When the voltage is applied with a low pulse, the low pulse is configured to change the magnetization of the free layer when the magnetization of the free layer is destabilized, and the low pulse is configured not to cause the tunnel barrier to act as an interfering source of heat. A polarity of the voltage determines when the magnetization of the free layer is parallel and antiparallel to a magnetization of the reference layer.

Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

Figure 1:
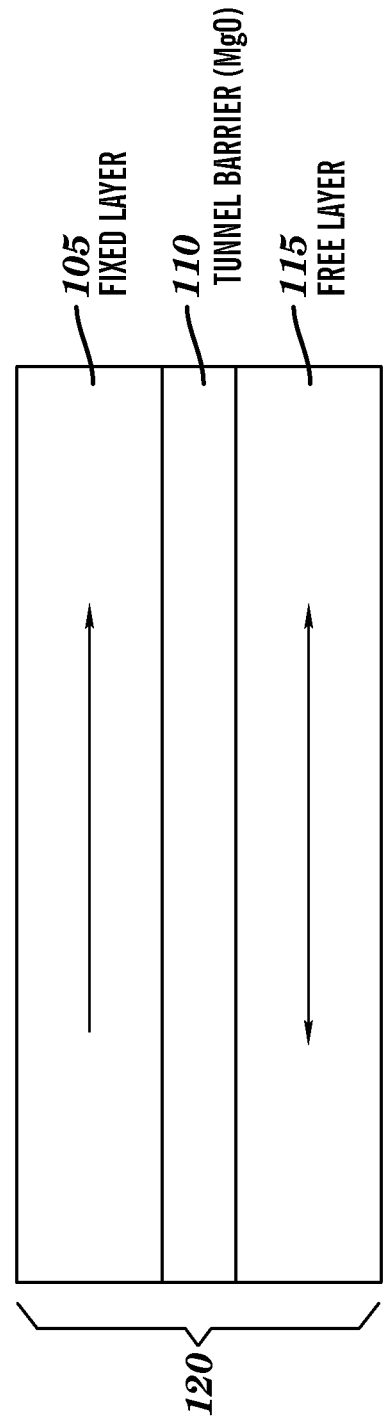
FIG. 1 is a cross sectional view of a spin-transfer torque MRAM 2-terminal device.

Magnetic random access memory (MRAM) is a non-volatile solid state memory technology compatible with standard semiconductor manufacturing. Information is stored in the magnetic orientation of a free layer film in relation to that of a reference film. Reading the state of the cell or bit is accomplished by measuring the electrical resistance of a magnetic tunnel junction formed by a sandwich of the free layer, a tunneling barrier, and the reference layer.

Writing the bit can be achieved in several ways, depending on the technology in use. For field-written MRAM, typical geometries make use of two orthogonal current-carrying wires which are placed in proximity to the magnetic tunnel junction. The current in the wires imposes a magnetic field on the MRAM cell, and with appropriate field amplitude, duration, and relative timing the orientation of the free layer can be written to the desired state. In spin-transfer torque MRAM, external fields are not used in the writing process. Instead, electrical currents passing between the reference layer and the free layer films carry not only a charge current but in addition a spin current. This spin current transferred between the two magnetic films (i.e., the reference layer and the free layer) acts to orient the free layer either parallel or antiparallel to the reference layer, depending on the sign of the electrical current.

Recently, a new mechanism of generating spin currents in a magnetic film has been described in "Initiation of spin-transfer torque by thermal transport from magnons", by John C. Slonczewski in Physical Review B 82, 054403 (2010), received Jun. 24, 2010 and published Aug. 3, 2010, which is herein incorporated by reference in its entirety. This technique involves the generation of spin waves in an insulating magnetic film by imposing a thermal gradient across the film. When these spin waves, or magnons, impinge on the interface between the insulating magnet and a non-magnetic metal, a spin current carried by electrons is generated. This mechanism is very efficient compared to the direct spin current used in the conventional spin-transfer torque MRAM cell, and hence requires lower power in order to switch a free layer which is situated on the other side of the non-magnetic metal film. However, as proposed, Slonczewski's method would not be able to write the free layer into either of two states (i.e., 1 or 0). This is because the cell must contain a heater on one side of the thin film stack and a heat sink on the other. These two elements cannot be simply reversed without undue power being required in order to heat either side of the device. Hence, exemplary embodiments provide a new mechanism to realize magnonic MRAM.

The magnetic field required to write a small magnetic bit increases with the reduction of the bit size. Magnetic storage technologies in either hard-disk drive (HDD) or magnetic random access memory (MRAM) are pushing against physical limits for magnetic fields available to write a magnetic bit with ever-diminishing size. Spin-transfer torque provides an alternative to direct current-induced writes, and spin-transfer torque avoids the use of magnetic fields altogether, extending the scaling prospects of these technologies. A spin-transfer torque-induced magnetic write operation has been heavily explored for extending the scaling of MRAM but has not particularly been available for HDD storage technologies. This is in large part because the spin-transfer torque used to date needs to be generated by a sizable electrical current, requiring electrical, and hence physical contact to the bits being written during the write operation. Exemplary embodiments provide approaches and devices for generating and utilizing spin-current and spin-transfer torque, for the manipulation and bidirectional writing of nanomagnet bits.

FIG. 1 illustrates an example of a spin-transfer torque MRAM 2-terminal device with a fixed layer 105 (pinned layer), a tunnel barrier 110, and a free layer 115 in a magnetic tunnel junction stack 120. The magnetization of the fixed layer 105 is fixed in one direction, such as, e.g., pointing to the right as illustrated in FIG. 1; an electrical current passed up through the magnetic tunnel junction stack 120 makes the free layer 115 parallel to the fixed layer 105, while a current passed down through the magnetic tunnel junction stack 120 makes the free layer 115 anti-parallel to the fixed layer 105. The free layer 115 is illustrated with double arrows to indicate that the magnetization is free to point to the left or right based on which direction the current is passed. When the magnetization of the free layer 115 points in the same direction (e.g., right) as the magnetization of the fixed layer 105, the free layer 115 is parallel to the fixed layer 105. When the magnetization of the free layer 105 points in the opposite direction (e.g., left) to the magnetization of the fixed layer 105, the free layer 115 is anti-parallel to the fixed layer 105.

Figure 2:
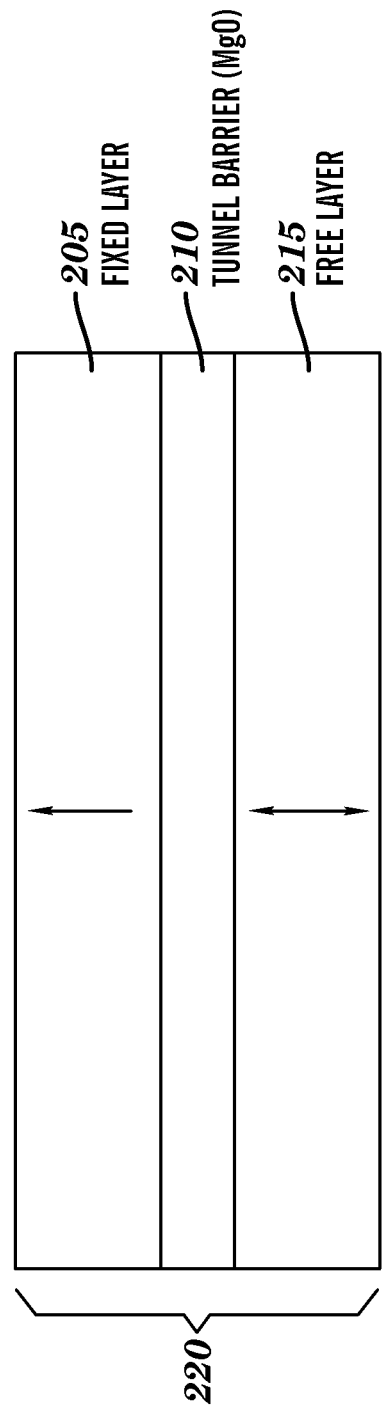
FIG. 2 is a cross sectional view of another spin-transfer torque MRAM 2-terminal device.

FIG. 2 illustrates an example of a spin-transfer torque MRAM 2-terminal device with a fixed layer 205 (pinned layer), a tunnel barrier 210, and a free layer 215 in a magnetic tunnel junction stack 220. The magnetization of the fixed layer 205 is fixed in one direction, such as, e.g., pointing up as illustrated in FIG. 2; a current passed up through the magnetic tunnel junction stack 220 makes the free layer 215 parallel to the fixed layer 205, while a current passed down through the magnetic tunnel junction stack 220 makes the free layer 215 antiparallel to the fixed layer 205. The free layer 215 is illustrated with double arrows to indicate that the magnetization is free to point to the up and down based on which direction the current is passed. When the magnetization of the free layer 215 points in the same direction (e.g., up) as the magnetization of the fixed layer 205, the free layer 215 is parallel to the fixed layer 205. When the magnetization of the free layer 215 points in the opposite direction (e.g., down) to the magnetization of the fixed layer 205, the free layer 215 is antiparallel to the fixed layer 205.

For FIGS. 1 and 2, a smaller current (of either polarity) is used to read the resistance of the devices 100 and 200, which depends on the relative orientations of the free layers 115 and 215 and fixed layers 105 and 205, respectively. In earlier attempts at spin-transfer torque MRAM, the free and fixed layers have their magnetizations lie in the plane, as shown in FIG. 1. However this leads to high switching (electrical) currents. State of the art uses materials with magnetization perpendicular to the plane as shown in FIG. 2; these have so-called perpendicular magnetic anisotropy, or PMA. However, in the state of the art, even with perpendicular anisotropy the switching (electrical) currents are still higher than desired.

Exemplary embodiments disclose a new scheme for using magnonic switching that allows a bidirectional write to the free layer (e.g., 1 or 0, parallel and antiparallel).

Figure 3:
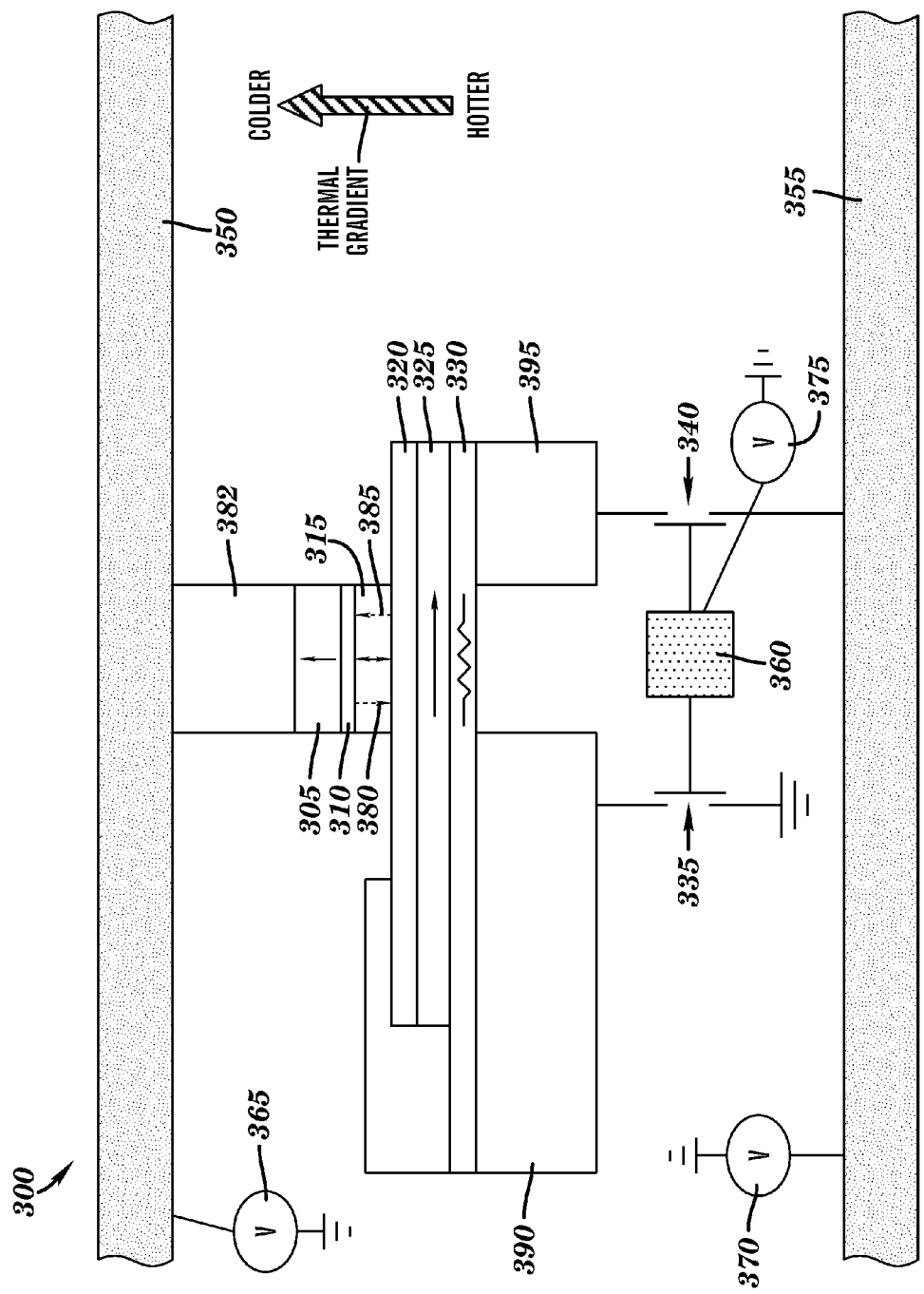
FIG. 3 illustrates a schematic of a magnetic random access memory device in accordance with an exemplary embodiment.

FIG. 3 illustrates a magnetic random access memory (MRAM) device 300 according to an exemplary embodiment. The MRAM device 300 includes a reference layer 305 (e.g., a fixed layer with a fixed magnetization direction or orientation that does not change), a tunnel barrier 310, and a free layer 315. The free layer 315 is illustrated with an up and down arrow to show that the magnetization of the free layer 315 can be either pointed up or down. The MRAM device 300 is designed for bidirectional writing (i.e., writing magnetization with an up and/or down orientation) of the free layer 315. In this case, the reference layer 305 has a magnetization pointing up so the bidirectional write can flip the magnetization of the free layer 315 to be parallel (up) and/or antiparallel (down) to the reference layer 305.

Figure 6:
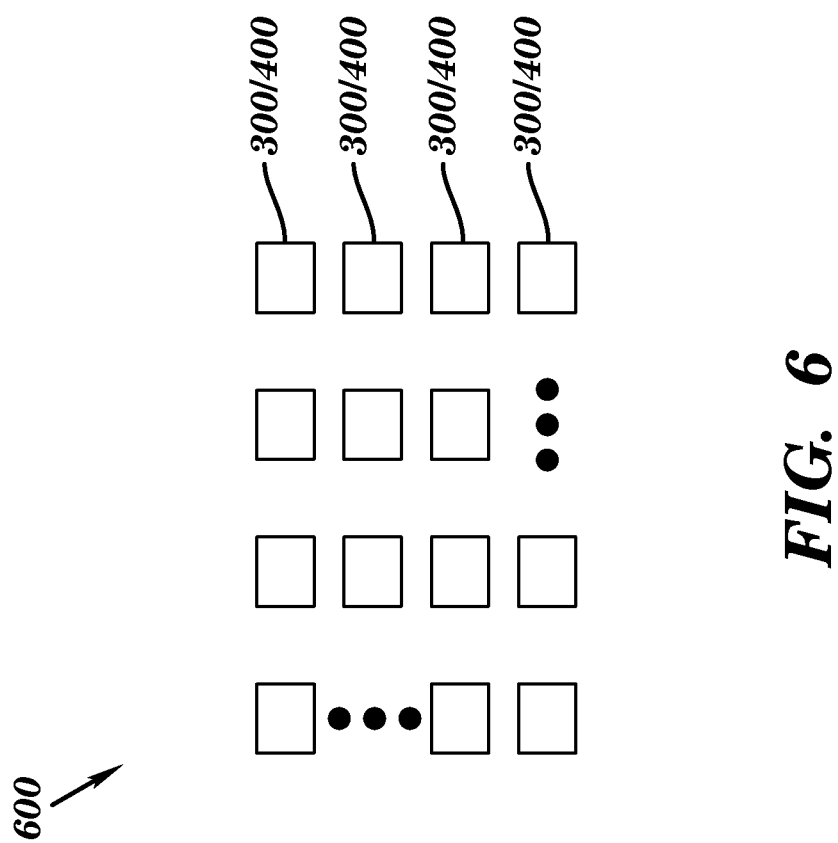
FIG. 6 illustrates an array of magnetic random access memory devices in accordance with an exemplary embodiment.

For the MRAM device 300, a perpendicular magnetic anisotropy (PMA) tunnel junction which is the free layer 315 (e.g., cobalt-iron-boron alloy), the tunnel barrier 310 (e.g., magnesium oxide (MgO)) and the reference layer 305 (e.g., cobalt-iron alloy). The free layer 315 is grown on top of a normal metal spacer 320 (e.g., a normal metal layer, such as, e.g., copper, tungsten or other similar normal metals), which in turn is grown on top of an insulating magnet 325 (e.g., such as a resistive magnet, ferrites, or other soft insulating magnets). Under the insulating magnet 325, there is a high resistance metal layer 330 which is used as a heater (i.e., a metal heater), connected across two vias. The normal metal spacer 320 is electrically connected to the high resistance metal layer 330. Two transistors 335 and 340 are used in each cell (a single MRAM device 300 is considered a cell when connected in an array), where one transistor 335 and the other transistor 340 are connected to either side of the high resistance metal layer 330 (metal heater). Although the structure of a single MRAM device 300 is shown, the MRAM device 300 (as a cell) is connected in an array (as shown in FIG. 6) to a plurality of MRAM devices 300 (cells) such that the numerous devices 300 are in columns and rows as understood by one skilled in the art.

The MRAM device 300 also includes a select line 360 for providing power to the gates of the transistors 335 and 340 (including identical transistors 335 and 340 for other MRAM devices 300 in the same column). A write line 350 is connected to a voltage source 365, a destabilize line 355 is connected to a voltage source 370, and the select line 360 is connected to the voltage source 375. A connecting metal 382 connects the write line 350 to the reference layer 305. A connecting metal 395 connects the transistor 340 to the high resistance metal layer 330. A connecting metal 390 connects the transistor 335 to the high resistance metal layer 330.

Writing to the MRAM device 300 corresponds to an up or down direction of magnetization of the free layer 315. If an up corresponds to, e.g., a 1 (or 0) for the free layer 315, then down would correspond to a 0 (or 1), and vice versa.

For example, for writing, a column of MRAM devices 300 (in the array of MRAM devices 300) is selected using the select line 360, and then the corresponding destabilize line 355 and write line 350 (out of the plurality destabilize lines 355 and write lines 350 corresponding to other MRAM devices 300 (i.e., cells) in the array) are activated for the particular MRAM device 300 (in the column of MRAM devices 300) to be written. A voltage of the voltage source 370 is applied to the destabilize line 355, and the electrical current from the destabilize line 355 heats up the high resistance heating layer 330 (metal heater or resistive heating layer) via joule heating. For example, electrical current from the destabilize line 355 through the transistor 340 flows to the high resistance metal layer 330 to heat the high resistance metal layer 330. As understood by one skilled in the art, Joule heating, also known as ohmic heating or resistive heating, is the process by which the passage of an electric current through a conductor (such as the high resistance metal layer 330) releases heat. This creates a temperature gradient (depicted as upward arrow from hotter to colder in FIG. 3) with the insulating magnet 325 hotter and the free layer 315 colder. In turn, this causes magnons (in the insulating magnet 325) to transport the heat across the insulating magnet 325. The magnons then generate spin polarized electrons at the interface with the normal metal spacer 320 and the insulating magnet 325; the spin polarized electrons transport the angular momentum across the normal metal spacer 320 into the free layer 315. Since the magnetization of the insulating magnet 325 is in-plane (i.e., the magnetization has a left or right orientation), the angular momentum of the spin polarized electrons (from the insulating magnet 320) destabilizes the magnetization of the free layer 315 by causing the free layer magnetization to rotate to be nearly parallel to that of the insulating magnet. Upon removal of the magnon-induced spin current, this orientation of the free layer would be energetically unfavorable, and the free layer would then fall back to either one of the (energetically equivalent) states pointing either up or down. In order to choose the final orientation of the free layer magnetization, a voltage of the voltage source 365 is simultaneously and/or slightly afterward applied to the write line 350, either positive or negative (depending on the direction the free layer 315 should be written). The positive or negative voltage of the voltage source 365 serves to 'tip' the free layer 315 either up or down, once the voltage source 370 of the destabilizing line 355 is turned off. Note that the voltage source 370 applied to the destabilize line 355 is turned off before the voltage source 365 applied to the write line 350 is turned off.

For example, consider the case when the free layer 315 has an up magnetization 385 state (shown by the right dashed arrow). The select line 360 is turned on by the voltage of the voltage source 375. The select line 360 turns on the transistors 335 and 340. The destabilize line 355 is turned on by the voltage of the voltage source 370 to provide electrical current to the insulating magnet 325, which acts as a heater that creates the temperature gradient. The temperature gradient causes the magnons to be produced in the insulating magnet 325 in which the magnons generate spin polarized electrons to transport the angular momentum across the insulating magnet 325 into the free layer 315. Since the spin polarized electrons have an angular momentum that is in-plane (left or right) according to the magnetization of the insulating magnet 325, this angular momentum disrupts/destabilizes the magnetization of the free layer 315 which is out of plane (up or down). Now, when the free layer 315 is in the destabilized state (e.g., after or during), a positive voltage can be applied to the write line 350 by the voltage source 365, which will then flip the up magnetization 385 to have the magnetization orientation like the down magnetization 380 arrow (shown by the left dashed arrow). Conversely, if the free layer 315 originally had a down magnetization 380 state, and if a negative voltage is applied to the write line 350 by the voltage source 365 after/during destabilization, then the down magnetization 380 arrow will flip to have the magnetization orientation like the up magnetization 385 arrow. As such, bidirectional writing can be performed to write the magnetization of the free layer 315 to be both antiparallel and/or parallel to the reference layer 305 based on the positive or negative voltage respectively supplied by the voltage supply 365.

Figure 4:
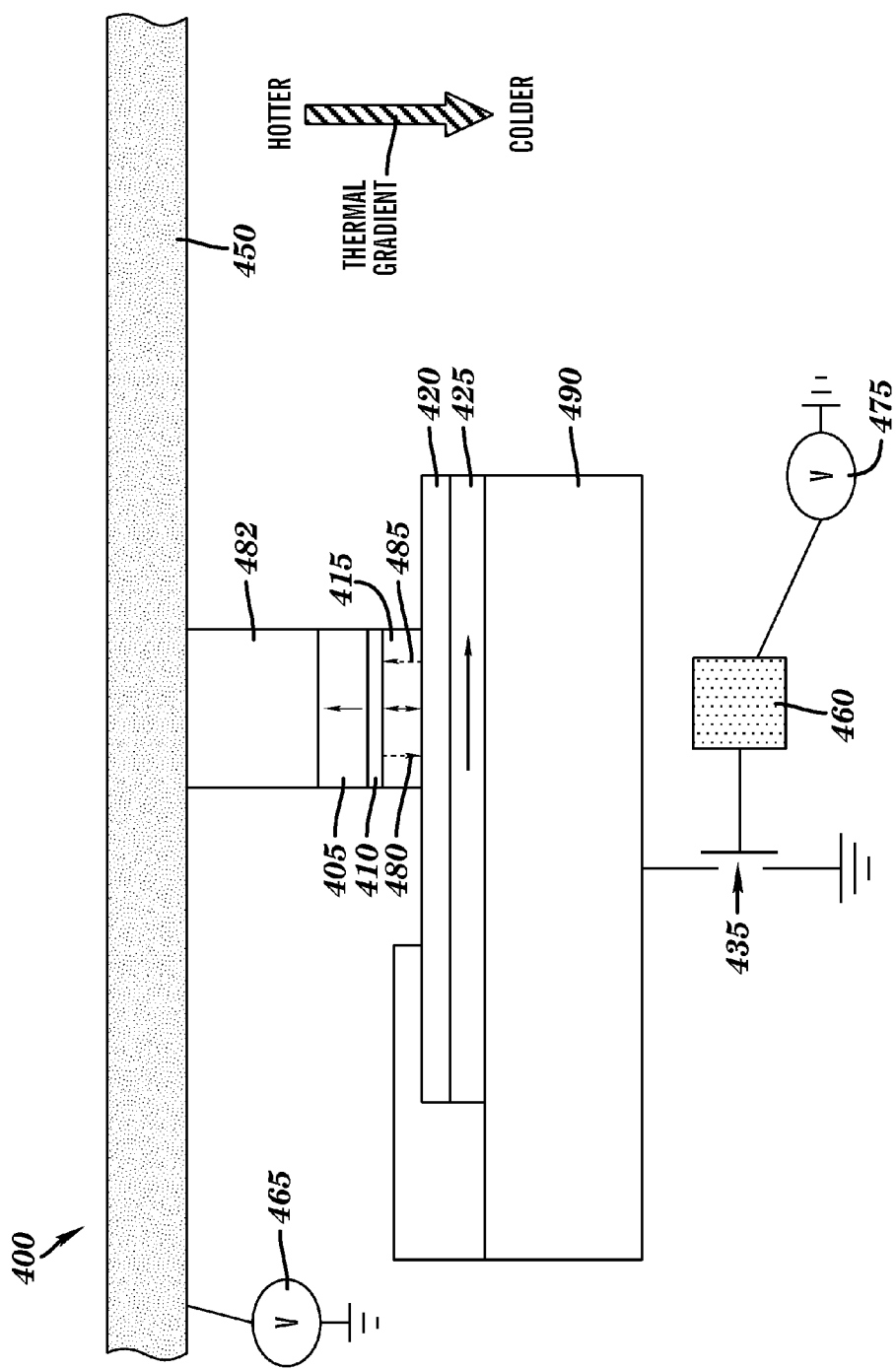
FIG. 4 illustrates a schematic of a magnetic random access memory device in accordance with an exemplary embodiment.

FIG. 4 illustrates a magnetic random access memory (MRAM) device 400 according to exemplary embodiments. FIG. 4 illustrates an additional implementation which is a two terminal device shown as MRAM device 400. In this case, the tunnel barrier 410 is used as the heater. The tunnel barrier 410 has a high resistance, e.g., 1000 ohms as compared to a reference layer 405 (e.g., 10 ohms) and a free layer 415 (e.g., 10 ohms).

A write line 450 is connected to a voltage source 465 and the free layer 415 via metal. In FIG. 4, there is no destabilizing line shown in FIG. 3. A normal metal spacer 420 is formed between the free layer 415 and an insulating magnet 425. A select line 460 is connected to a transistor 435 and a voltage source 475. The transistor 435 connects to the insulating magnet 425 and the metal spacer 420 via a connecting metal 490. In FIG. 4, a connecting metal 482 connects the write line 450 to the reference layer 405.

Although the structure of a single MRAM device 400 is shown, the MRAM device 400 (as a cell) may be connected in an array (as shown in FIG. 6) to a plurality of MRAM devices 400 (cells) such that the numerous MRAM devices 400 are in columns and rows as understood by one skilled in the art.

Figure 5:
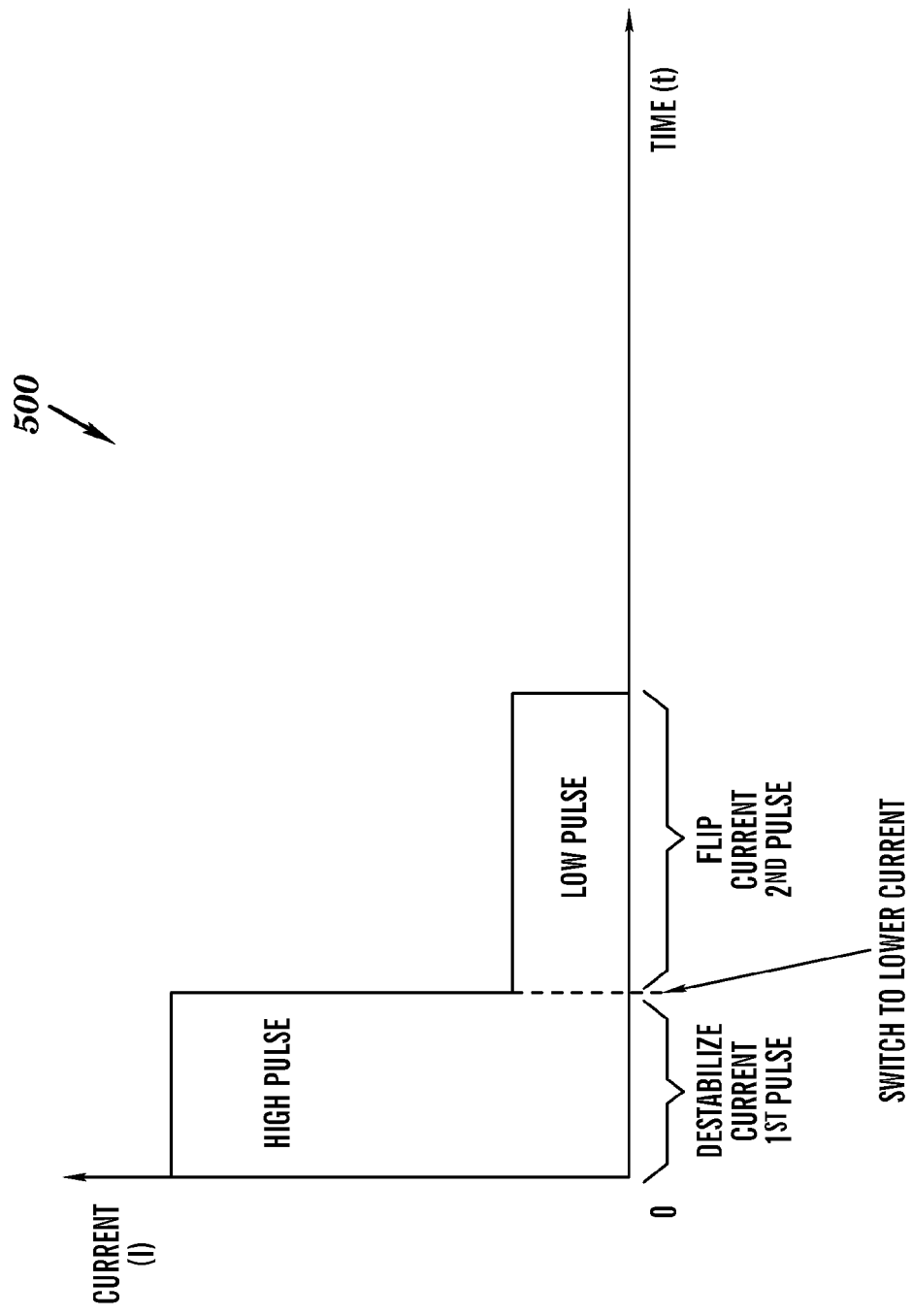
FIG. 5 illustrates a graph of electrical current versus time in accordance with an exemplary embodiment.

Referring to FIG. 4, for writing in the MRAM device 400, a voltage of the voltage source 465 is applied to the write line 450, which heats up the tunnel barrier 410 (acting as a high resistance heating layer or metal heater) via joule heating. For example, electrical current from the write line 450 flows through the connecting metal 482, through the reference layer 405, and into the tunnel barrier 410. The tunnel barrier 410 heats up, and this creates a temperature gradient (depicted as downward arrow from hotter to colder in FIG. 4) with the tunnel barrier 410 hotter, such that heat flows through the free layer 415, through the metal spacer 420, and into the insulating magnet 425. In turn, this causes magnons (in the insulating magnet 425) to transport the heat across the insulating magnet 425 as discussed in FIG. 3. The magnons then generate spin polarized electrons at the interface with the metal spacer 420 and insulating magnet 425, and the spin polarized electrons transport the angular momentum (of the insulating magnet 425) across the normal metal spacer 420 into the free layer 415. Since the magnetization of the insulating magnet 425 is in-plane (i.e., the magnetization has a left or right orientation), the angular momentum of the spin polarized electrons from the insulating magnet 425 destabilizes the magnetization of the free layer 415; this is called magnonic destabilization because the magnetization of the free layer 415 is temporarily placed in an in-plane state (i.e., left or right orientation) and/or leans toward an in-plane state, but the conditions are not stable because the magnetization of the free layer 415 is designed to be out of plane (i.e., up or down orientation). The magnonic destabilization is turned off before the tipping torque by using a two pulse scheme according to exemplary embodiments, as shown in FIG. 5. The high pulse (depicted as destabilize current $1^{st}$ pulse in FIG. 5) of the voltage source 465 is a large amplitude to begin with in order to destabilize the free layer 415, and then the high pulse amplitude is decreased (e.g., like a step function). As shown in FIG. 5, the current (I) initially is high to destabilize the free layer 415 by heating up the tunnel barrier 410 via joule heating to cause a thermal gradient, which in turn causes spin polarized electrons to be generated in the insulating magnet 425 and flow into the free layer 415.

At a lower current (i.e., the flip current) the magnonic destabilization is mostly turned off (because magnonic torque is proportional to current squared ($I^2$)), while the direct spin-transfer torque due to the applied current (which is proportional to current (I)) is still active; the spin-transfer torque from the electrical current (as opposed to the heat current) during the low pulse determines the final state (i.e., the up or down magnetization). During the low pulse, the tunnel barrier 410 does not act as an interfering source of heat. A positive/negative current from the voltage source 465 is used to write a 1/0, or vice versa.

For example, consider the writing case when the free layer 415 has a down magnetization 480 state (shown by the left dashed arrow). The select line 460 is turned on by the voltage of the voltage source 475. The select line 460 turns on (power the gate of) the transistor 435. The write line 450 is turned on (i.e., energized) by the voltage of the voltage source 465 to provide electrical current at a high amplitude (as shown in FIG. 5) to the tunnel barrier 410, which acts as a heater that creates the temperature gradient. The temperature gradient causes the magnons to be produced in the insulating magnet 425 in which the magnons generate spin polarized electrons to transport the angular momentum across the normal metal spacer 420 into the free layer 415. Since the spin polarized electrons have an angular momentum that is in-plane (left or right) according to the magnetization of the insulating magnet 425, this angular momentum disrupts/destabilizes the magnetization of the free layer 415 which is out of plane (up or down). Once the high amplitude current (high pulse) is switched to the low amplitude current (i.e., flip current or low pulse) and when a positive voltage is applied to the write line 450 by the voltage source 465 to generate a positive electrical current, this positive electrical current will then flip the down magnetization 480 arrow to have the magnetization orientation like the up magnetization 485 arrow (shown by the left dashed arrow). The up magnetization 485 of the free layer 415 means that the magnetization of the free layer 415 is parallel to the up magnetization of the reference layer 405 in this example. Conversely, if the free layer 415 originally had an up magnetization 485 state, and if a negative voltage (generating a negative current) is applied to the write line 450 by the voltage source 465 (during or after destabilization), then the up magnetization 485 arrow will flip to have the magnetization orientation like the down magnetization 480 arrow when the voltage source 465 drops to the lower current (depicted as flip current $2^{nd}$ pulse) shown in FIG. 5. As such, bidirectional writing can be performed to write the magnetization of the free layer 415 to be both antiparallel and/or parallel to the reference layer 405 based on the positive or negative voltage (current) supplied by the voltage supply 465.

FIG. 6 illustrates an example of an array 600 MRAM devices according to exemplary embodiments. Each MRAM device 300 and/or MRAM device 400 may be considered as a cell in the array 600 of MRAM devices for the bidirectional writing of bits, such as a 1 and 0 to correspond to an up or down magnetization of the free layers 315 and 415 as discussed herein. One skilled in the art understands how to read the bits of each MRAM device 300, 400 (i.e., cell) by reading the resistance.

Figure 7:
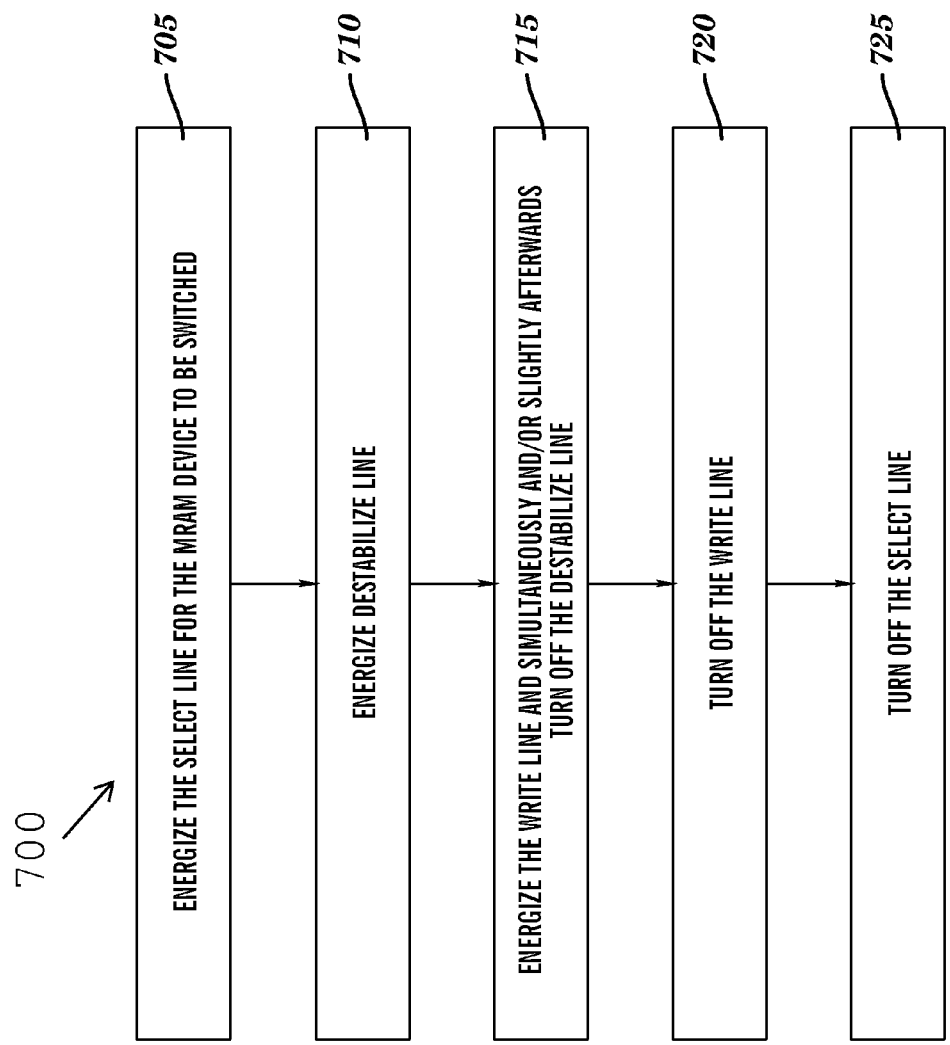
FIG. 7 is a flow chart illustrating a method for bidirectional writing in accordance with an exemplary embodiment.

FIG. 7 illustrates a flow chart 700 for bidirectional writing (e.g., both 1's and 0's) according to exemplary embodiments. Reference can be made to FIG. 3.

At block 705, the select line 360 is energized via the voltage source 375 (i.e., select line bias) for the MRAM device 300 (i.e., cell in the array 600) that is to be switched. This activates the two transistors 335 and 340.

At block 710, the destabilize line 355 is energized via the voltage source 370. This causes electrical current to flow through the high resistance metal layer 330 (i.e., normal metal heater), and raises its temperature. Heat flows from the high resistance metal layer 330 through the insulating magnet 325 and through the stack (i.e., free layer 315, tunnel barrier 310, and reference layer 305) towards the write line 350.

At block 715, the write line 350 is energized via the voltage source 365 (i.e., write line bias), and simultaneously and/or slightly afterwards the destabilize line 355 (i.e., the voltage source 370) is turned off. This causes spin-transfer torque to act on the free layer 315, and depending on the sign of the energize write line 350 voltage applied by the voltage source 365, the spin-transfer torque will either cause the free layer 315 to tend towards parallel or antiparallel orientation as compared to the reference layer 305. Note that the electrical current (via the voltage source 365) through the MRAM device 300 should be present while the temperature gradient (i.e., heat) established in block 710 still exists so that the threshold for writing is not diminished.

At block 720, the voltage source 365 (i.e., write line bias) is turned off because the magnetization of the free layer 315 has flipped according to the polarity of the voltage source. The voltage source 375 (i.e., select line bias) is turned off at block 725.

The polarity of the voltage applied by the voltage source 365 to the write line 350 determines the magnetization orientation of the free layer 315 because the magnetization of the free layer 315 is not limited to be written in a single direction which is unidirectional writing. For example, a positive voltage of voltage source 365 causes the magnetization to be up (e.g., up magnetization 385) and a negative voltage of the voltage source 365 causes the magnetization to be down (e.g., down magnetization 380).

Figure 8:
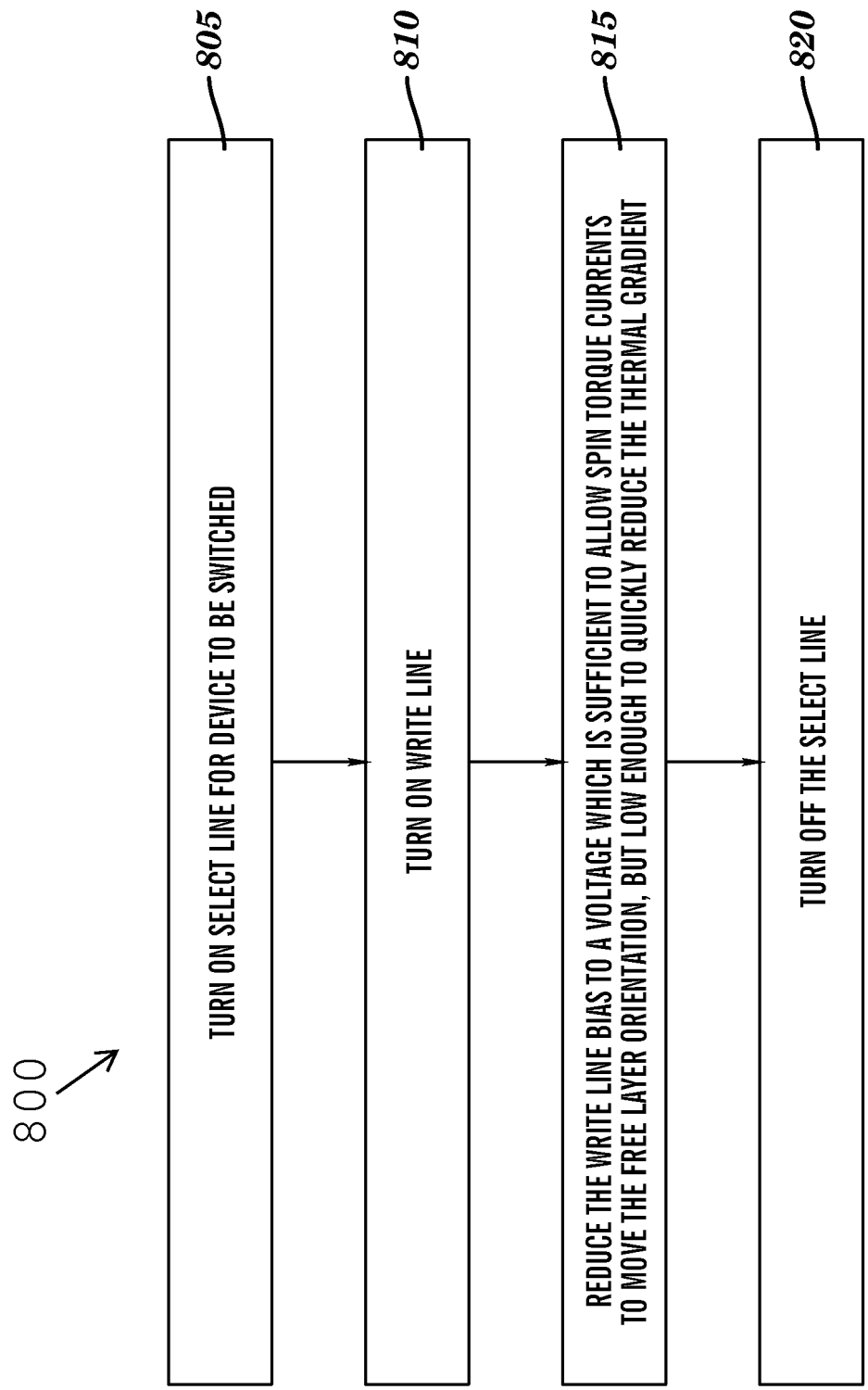
FIG. 8 is a flow chart illustrating a method for bidirectional writing in accordance with an exemplary embodiment.

FIG. 8 illustrates a flow chart 800 for bidirectional writing (e.g., both 1's and 0's) according to exemplary embodiments. Reference can be made to FIGS. 4 and 5.

At block 805, the select line 460 is turned on via voltage source 475 for the MRAM device 400 (i.e., a cell in the array 600) to be switched. This activates the transistor 435.

At block 810, the write line 450 is turned on via the voltage source 465. The polarity of the voltage source 465 will determine the eventual state of the free layer 415, such that for one polarity of electrical current the MRAM device 400 will prefer parallel orientation of the free layer 415 and reference layer 405, while for the other polarity of electrical current the opposite orientation (anti-parallel) of the free layer 415 and reference layer 405 will be preferred. The current amplitude (write line bias amplitude) should be sufficient to create a significant thermal gradient at the insulating magnet 425 (ferrite)/normal metal spacer 420 interface, due to Joule heating in the tunnel barrier 410. For example, in one implementation, a Gaussian electrical current pulse of pulse width 500 pico-seconds and amplitude $2 \times 10^6$ ampere/cm$^2$ flowing through the joule heater creases a temperature difference of 10-12 Kelvin at the metal-insulating magnet interface.

At block 815, the voltage (write line bias) of the voltage source 465 is reduced (from the destabilize current (high pulse) to the flip current (low pulse) as shown in FIG. 5) to a voltage which is sufficient to allow spin-transfer torque currents (from the insulating magnet 425) to move the free layer orientation, but low enough to quickly reduce the thermal gradient. In one implementation, a heating pulse of high enough amplitude (e.g., $2 \times 10^6$ ampere/cm$^2$) supplied for a duration of 0.5 ns to 1.0 ns can be utilized to complete the entire switching event within 2 ns. During this period, the free layer 415 will switch to the preferred state (as determined by the polarity of the electrical current from the voltage source 465), and the energy barrier in the free layer 415 for subsequent switching will ramp up to a high value. Quickly reducing the thermal gradient takes the free layer 415 out of a destabilizing state after the magnetization of the free layer 415 is flipped. The low pulse (i.e., low current in FIG. 5) has an amplitude that is low enough to stop/prevent the heating of the tunnel barrier 410. The high pulse is applied prior to the low pulse.

At block 820, the select line 460 (i.e., voltage source 475) is turned off. The polarity of the voltage applied by the voltage source 465 to the write line 450 determines the magnetization orientation of the free layer 415. For example, a positive voltage of voltage source 465 causes the magnetization to be up (e.g., up magnetization 485) and a negative voltage of the voltage source 465 causes the magnetization to be down (e.g., down magnetization 480).

Also, note that the free layer (e.g., in FIGS. 3-8) is designed to be out of plane in the absence of destabilizing spin-transfer torque. In other implementations, the MRAM devices (discussed in FIGS. 3-8) may be designed to be in-plane in the absence of destabilizing spin-transfer torque.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A magnetic random access memory device, comprising:
   a reference layer adjacent to a tunnel barrier, a free layer adjacent to the tunnel barrier, a metal spacer adjacent to the free layer, an insulating magnet adjacent to the metal spacer, and a metal heater adjacent to the insulating layer;
   wherein, responsive to a thermal gradient, the insulating magnet is configured to generate spin polarized electrons;
   wherein the spin polarized electrons generated from the insulating magnet destabilize a magnetization of the free layer;
   wherein an applied voltage to the MRAM device changes the magnetization of the free layer when the magnetization of the free layer is destabilized; and
   wherein a polarity of the applied voltage determines whether the magnetization of the free layer is parallel or antiparallel to a magnetization of the reference layer.

2. The device of claim 1, wherein when the polarity of the applied voltage is positive, the magnetization of the free layer is flipped to have one magnetization orientation; and
   wherein when the polarity of the applied voltage is negative, the magnetization of the free layer is flipped to have another magnetization orientation.

3. The device of claim 1, wherein the thermal gradient is caused by energizing the metal heater, and the thermal gradient flows from a high resistance layer, through the insulating magnet, through the metal spacer, and into the free layer; and
   wherein the thermal gradient generates the spin polarized electrons with an angular momentum that destabilizes the magnetization of the free layer.

4. A magnetic random access memory device, comprising:
   a reference layer adjacent to a tunnel barrier, a free layer adjacent to the tunnel barrier, a metal spacer adjacent to the free layer, and an insulating magnet adjacent to the metal spacer, in which the reference layer, the tunnel barrier, the free layer, the metal spacer, and the insulating magnet from a structure;
   wherein a first voltage pulse at a first amplitude applied to the structure is configured to cause the tunnel barrier to act as a heater in which the heater heats the insulating magnet to generate spin polarized electrons;
   wherein the first voltage pulse is configured to destabilize a magnetization of the free layer by the spin polarized electrons generated from the insulating magnet;
   wherein a second voltage pulse applied at a second amplitude is configured to change the magnetization of the free layer when the magnetization of the free layer is destabilized, and without causing the tunnel barrier to act as an interfering source of heat; and
   wherein a polarity of the second voltage pulse determines whether the magnetization of the free layer is parallel or antiparallel to a magnetization of the reference layer.

5. The device of claim 4, wherein the first voltage pulse is configured to provide a high electrical current that causes the tunnel barrier to act as the heater; and
   wherein the first voltage pulse is configured to provide a first magnitude of electrical current that does not cause the thermal barrier to act as the heater.

6. The device of claim 4, where the first voltage pulse is applied prior to the second voltage pulse.

7. The device of claim 4, wherein when the polarity of the second voltage pulse is positive, the magnetization of the free layer is flipped to have one magnetization orientation; and
   wherein when the polarity of the second voltage pulse is negative, the magnetization of the free layer is flipped to have another magnetization orientation.

8. The device of claim 4, wherein a thermal gradient caused by the heat of the tunnel barrier flows from the tunnel barrier, through the free layer, through the metal spacer, and into the insulating magnet; and
   wherein the thermal gradient generates the spin polarized electrons with an angular momentum that destabilizes the magnetization of the free layer.

9. A method for bidirectional writing of a magnetic random access memory (MRAM) device having a reference layer, a tunnel barrier adjacent the reference layer, a free layer adjacent the tunnel barrier, a metal spacer adjacent the free layer, an insulating magnet adjacent the metal spacer, and a metal heater adjacent the insulating magnet, the method comprising:
   causing the insulating magnet to generate spin polarized electrons in response to a thermal gradient;
   initiating destabilizing a magnetization of the free layer by the spin polarized electrons generated from the insulating magnet; and
   applying a voltage to the MRAM device, following the initiating the destabilizing, in order to select the magnetization of the free layer;
   wherein a polarity of the voltage determines whether the magnetization of the free layer is parallel or antiparallel to a magnetization of the reference layer.

10. The method of claim 9, wherein when the polarity of the voltage is positive, the magnetization of the free layer is flipped to have one magnetization orientation; and
    wherein when the polarity of the voltage is negative, the magnetization of the free layer is flipped to have another magnetization orientation.

11. The method of claim 9, wherein the initiating destabilizing the magnetization of the free layer by the spin polarized electrons generated from the insulating magnet comprises:
    energizing the metal heater so as to cause the thermal gradient to flow from a high resistance layer, through the insulating magnet, through the metal spacer, and into the free layer;
    wherein the thermal gradient generates the spin polarized electrons with an angular momentum that destabilizes the magnetization of the free layer.

12. A method for bidirectional writing of a magnetic random access memory (MRAM) device having a reference layer adjacent to a tunnel barrier, a free layer adjacent to the tunnel barrier, a metal spacer adjacent to the free layer, and an insulating magnet adjacent to the metal spacer, the method comprising:
    applying a first voltage pulse to the MRAM device at a first amplitude sufficient to cause the tunnel barrier to act as a heater that heats the insulating magnet so as to generate spin polarized electrons;
    destabilizing a magnetization of the free layer by the spin polarized electrons generated from magnons in the insulating magnet; and
    applying a second voltage pulse to the MRAM device at a second amplitude sufficient to change the magnetization of the free layer when the magnetization of the free layer is destabilized, wherein the second amplitude is low enough so not to cause the tunnel barrier to act as an interfering source of heat;
    wherein a polarity of the second voltage pulse determines whether the magnetization of the free layer is parallel or antiparallel to a magnetization of the reference layer.

13. The method of claim 12, wherein the first voltage pulse is configured to provide a first magnitude of electrical current that causes the tunnel barrier to act as the heater; and
    wherein the second voltage pulse is configured to provide a second magnitude of electrical current that does not cause the thermal barrier to act as the heater.

14. The method of claim 12, wherein the first voltage pulse is applied prior to the second voltage pulse.

15. The method of claim 12, wherein when the polarity of the second voltage pulse is positive, the magnetization of the free layer is flipped to have one magnetization orientation; and
    wherein when the polarity of the second voltage pulse is negative, the magnetization of the free layer is flipped to have another magnetization orientation.

16. The method of claim 12, wherein destabilizing the magnetization of the free layer by the spin polarized electrons generated from the insulating magnet comprises:
    causing a thermal gradient from the tunnel barrier, through the free layer, through the metal spacer, and into the insulating magnet;
    wherein the thermal gradient generates the spin polarized electrons with an angular momentum that destabilizes the magnetization of the free layer.

* * * * *